United States Patent
Kim et al.

(10) Patent No.: US 11,848,446 B2
(45) Date of Patent: Dec. 19, 2023

(54) ANODE-FREE RECHARGEABLE LITHIUM BATTERY INCLUDING TRANSITION METAL DICHALCOGENIDE LAYER AND METHOD OF MANUFACTURING SAME

(71) Applicant: KOREA UNIVERSITY OF TECHNOLOGY AND EDUCATION INDUSTRY—UNIVERSITY COOPERATION FOUNDATION, Cheonan-si (KR)

(72) Inventors: Suk Jun Kim, Cheonan-si (KR); Jun Ho Lee, Osan-si (KR)

(73) Assignee: KOREA UNIVERSITY OF TECHNOLOGY AND EDUCATION INDUSTRY-UNIVERSITY COOPERATION FOUNDATION, Cheonan-si (KR)

( * ) Notice: Subject to any disclaimer, the term of this patent is extended or adjusted under 35 U.S.C. 154(b) by 153 days.

(21) Appl. No.: 17/524,308

(22) Filed: Nov. 11, 2021

(65) Prior Publication Data

US 2023/0022140 A1 Jan. 26, 2023

(30) Foreign Application Priority Data

Jul. 22, 2021 (KR) .................. 10-2021-0096212

(51) Int. Cl.
*H01M 4/58* (2010.01)
*H01M 4/583* (2010.01)
(Continued)

(52) U.S. Cl.
CPC ............. *H01M 4/581* (2013.01); *C23C 14/35* (2013.01); *C23C 14/5806* (2013.01);
(Continued)

(58) Field of Classification Search
None
See application file for complete search history.

(56) References Cited

U.S. PATENT DOCUMENTS

2008/0241703 A1* 10/2008 Yamamoto ........ H01M 10/0525
429/220
2019/0207201 A1* 7/2019 Dai ...................... H01M 4/483
(Continued)

FOREIGN PATENT DOCUMENTS

KR 10-2018-0032168 A 3/2018
KR 10-2019-0083877 A 7/2019

OTHER PUBLICATIONS

Eunho Cha et al., "2D MoS2 as an efficient protective layer for lithium metal anodes in high performance Li—S batteries", Nature Nanotechnology, 2018, pp. 337-344, vol. 13.

Weiwen Wang et al., "Lithium Phosphorus Oxynitride as an Efficient Protective Layer on Lithium Metal Anodes for Advanced Lithium-Sulfur Batteries", Energy storage materials, 22019, pp. 414-422, vol. 18.

(Continued)

*Primary Examiner* — Christopher P Domone
(74) *Attorney, Agent, or Firm* — Sughrue Mion, PLLC

(57) ABSTRACT

Disclosed is a negative electrode current collector for an anode-free lithium metal battery. The negative electrode current collector includes a PdTe$_2$ layer and an intermediate layer to inhibit the growth of lithium dendrite, resulting in significant improves in lifespan and performance of the lithium metal battery. The negative electrode current collector further includes an ion conductive layer to improve the performance of the lithium metal battery.

4 Claims, 18 Drawing Sheets

(51) Int. Cl.

| | |
|---|---|
| *H01M 4/04* | (2006.01) |
| *H01M 4/66* | (2006.01) |
| *H01M 10/052* | (2010.01) |
| *C23C 14/35* | (2006.01) |
| *C23C 14/58* | (2006.01) |
| *H01M 10/0562* | (2010.01) |
| *H01M 4/02* | (2006.01) |

(52) U.S. Cl.
CPC ....... *H01M 4/0426* (2013.01); *H01M 4/0471* (2013.01); *H01M 4/661* (2013.01); *H01M 10/052* (2013.01); *H01M 10/0562* (2013.01); *H01M 2004/021* (2013.01); *H01M 2004/027* (2013.01); *H01M 2300/0068* (2013.01)

(56) References Cited

U.S. PATENT DOCUMENTS

2019/0260066 A1\* 8/2019 Hu .................. H01M 50/42
2022/0223868 A1\* 7/2022 Choi ................. H01M 4/136

OTHER PUBLICATIONS

Office Action dated Apr. 10, 2023 from the Korean Patent Office in Application No. 10-2021-0096212.
Guannan Zu et al., "Revealing Failure Mechanism of Transition-Metal Chalcogenides towards Copper Current Collector in Secondary Batteries", Journal of Materials Chemistry A, Mar. 17, 2020, pp. 1-32 (33 total pages).
Nian-Wu Li et al., "An Artificial Solid Electrolyte Interphase Layer for Stable Lithium Metal Anodes", Advanced Materials, 2016, vol. 28, pp. 1853-1858 (6 total pages).

\* cited by examiner

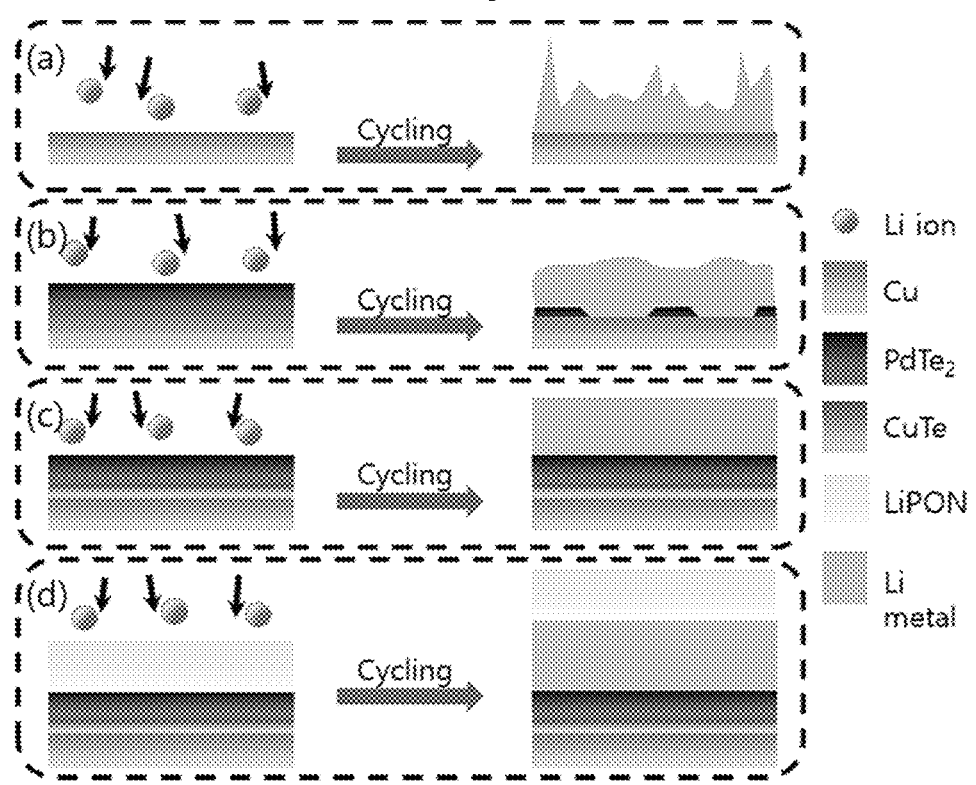

[Fig. 4]
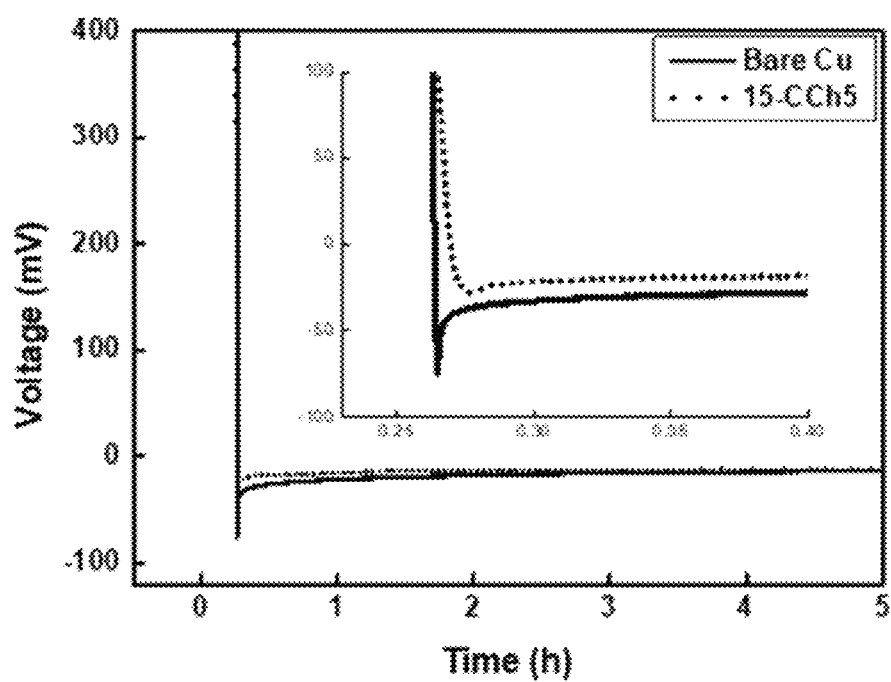

[Fig. 5]
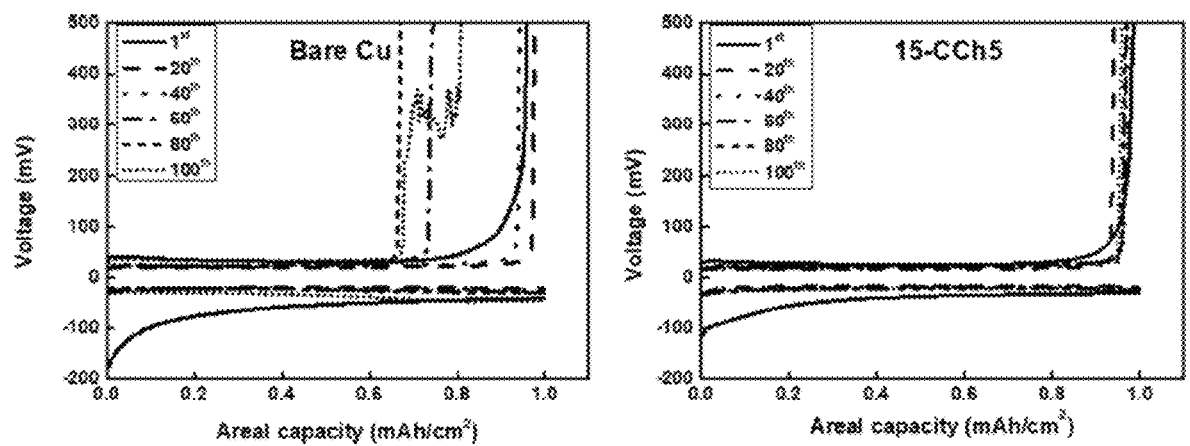

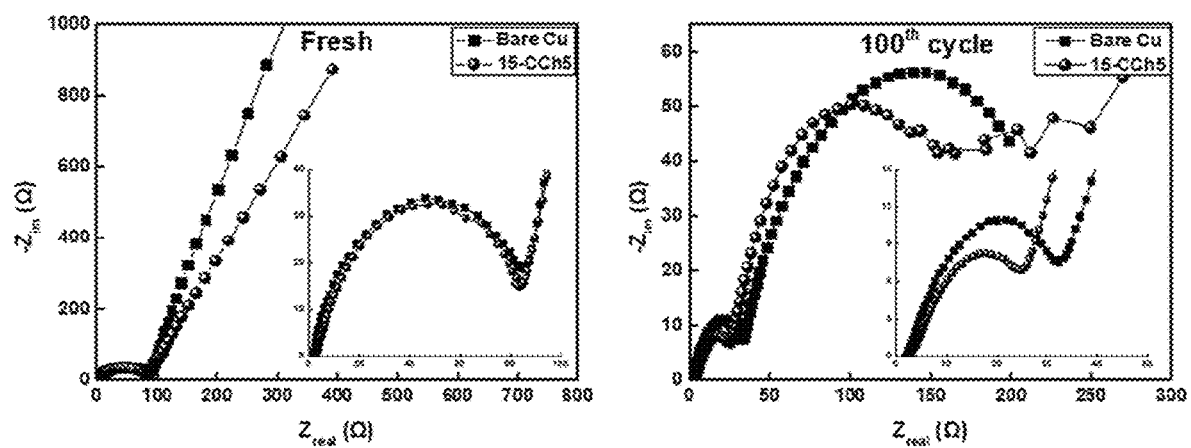
[Fig. 6]

[Fig. 7]
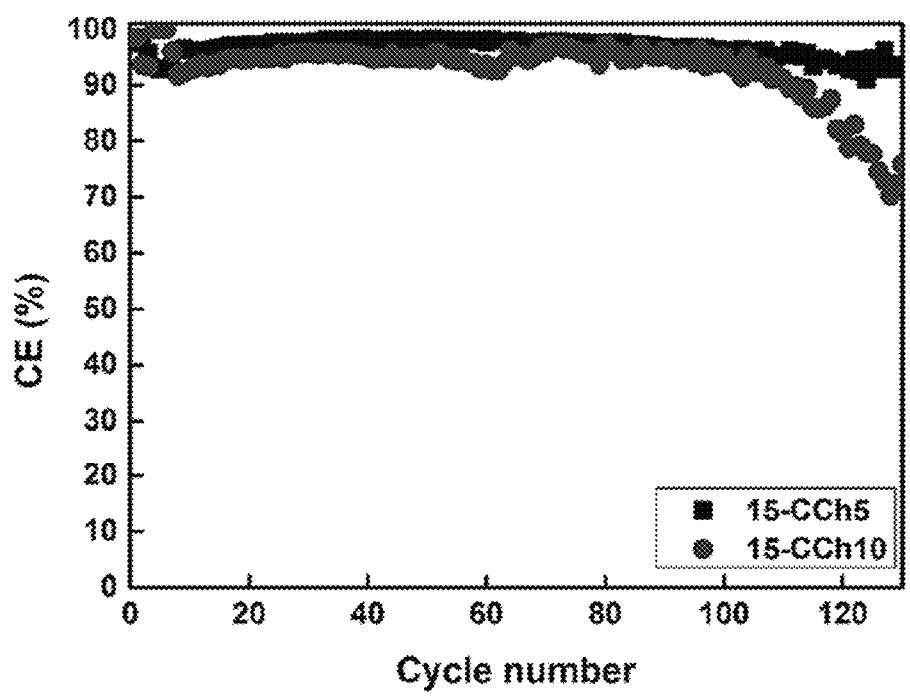

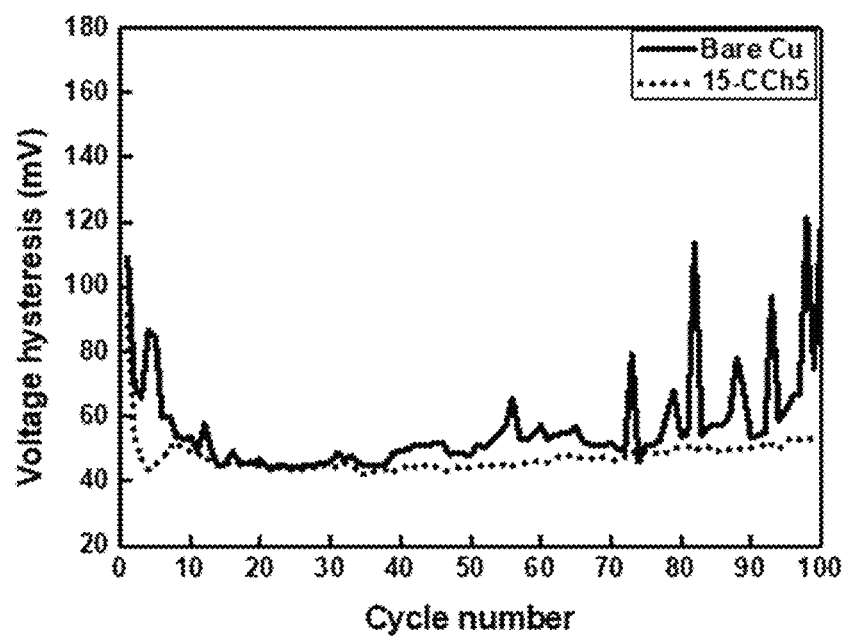
[Fig. 8]

[Fig. 9]
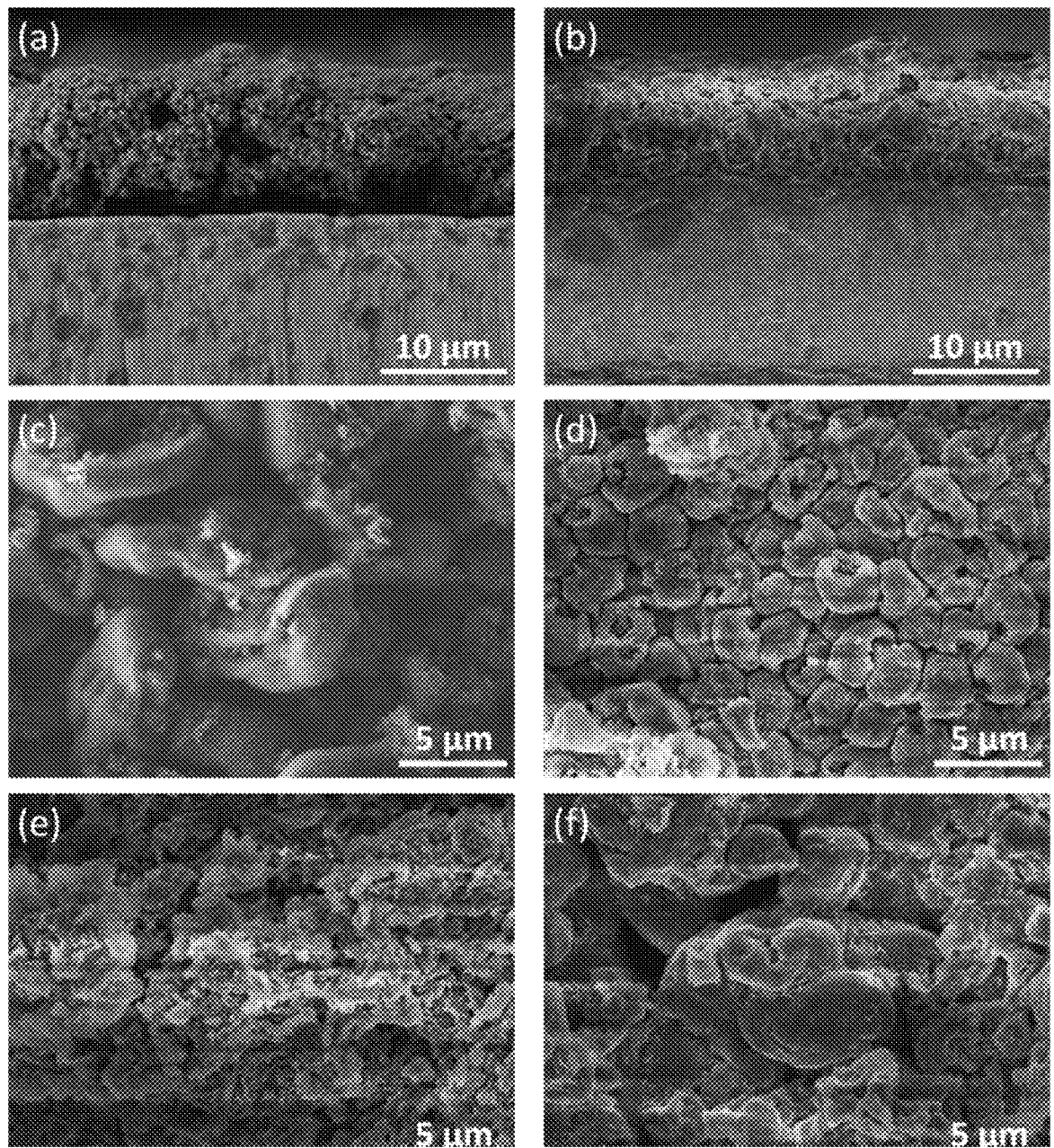

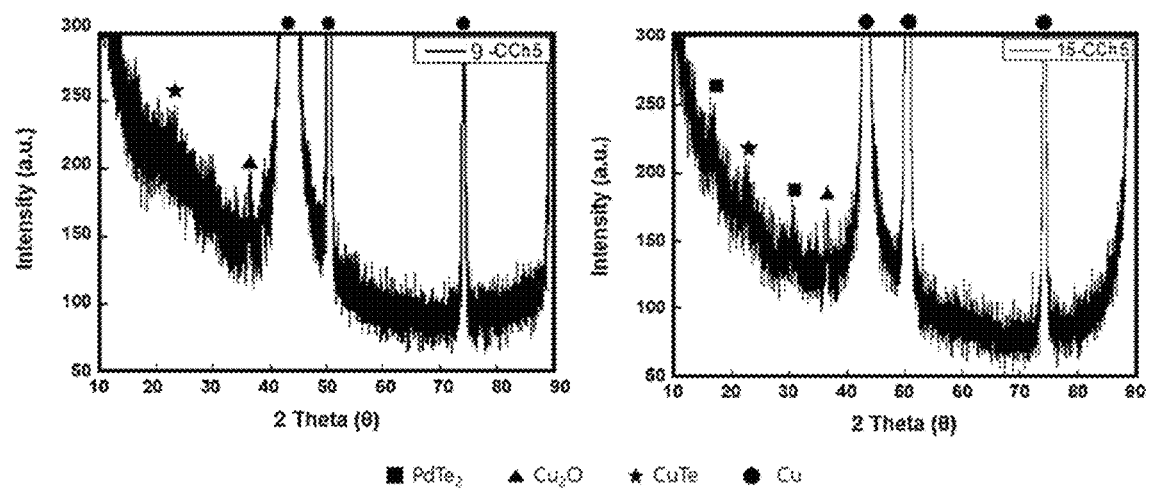
[Fig. 10]

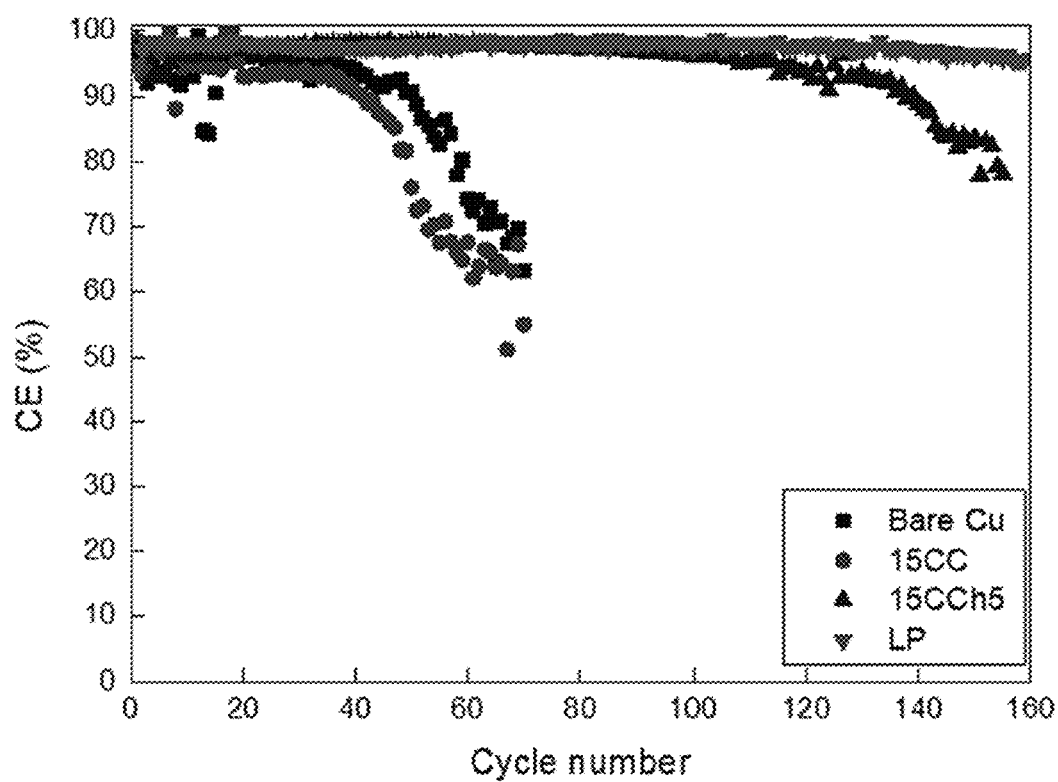
[Fig. 11]

[Fig. 12]
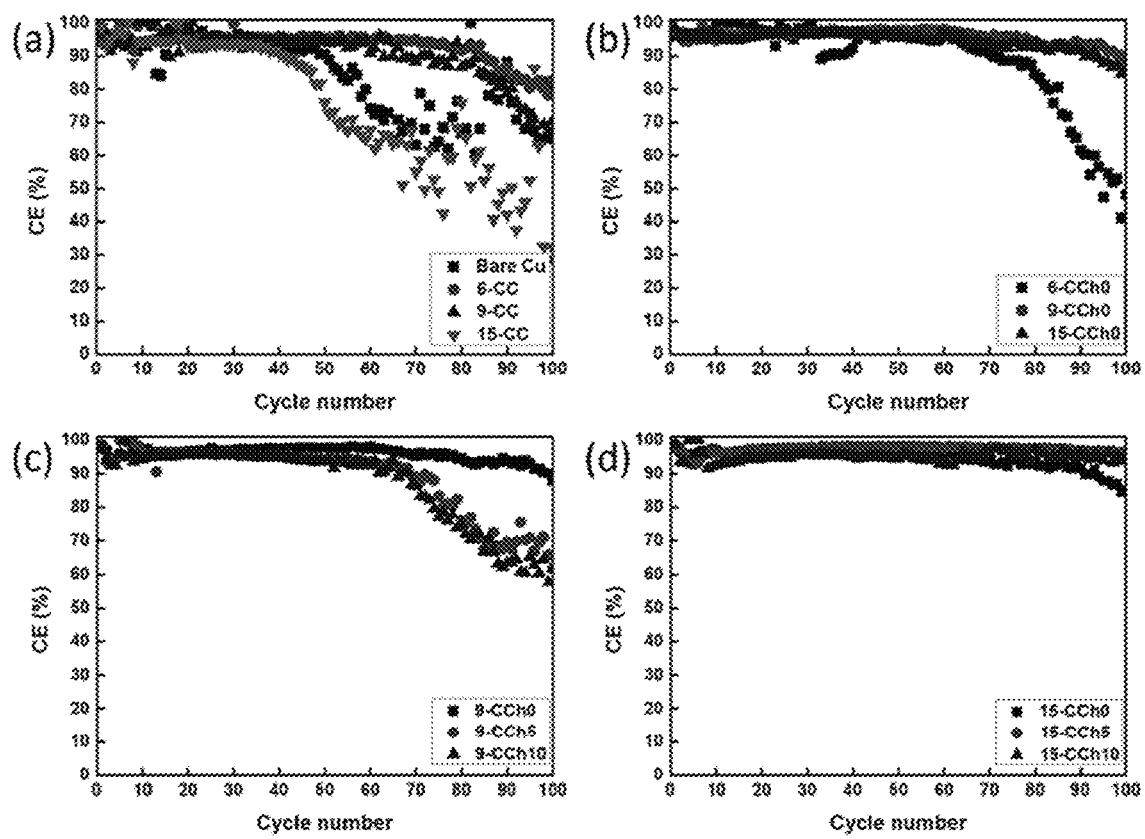

[Fig. 13]
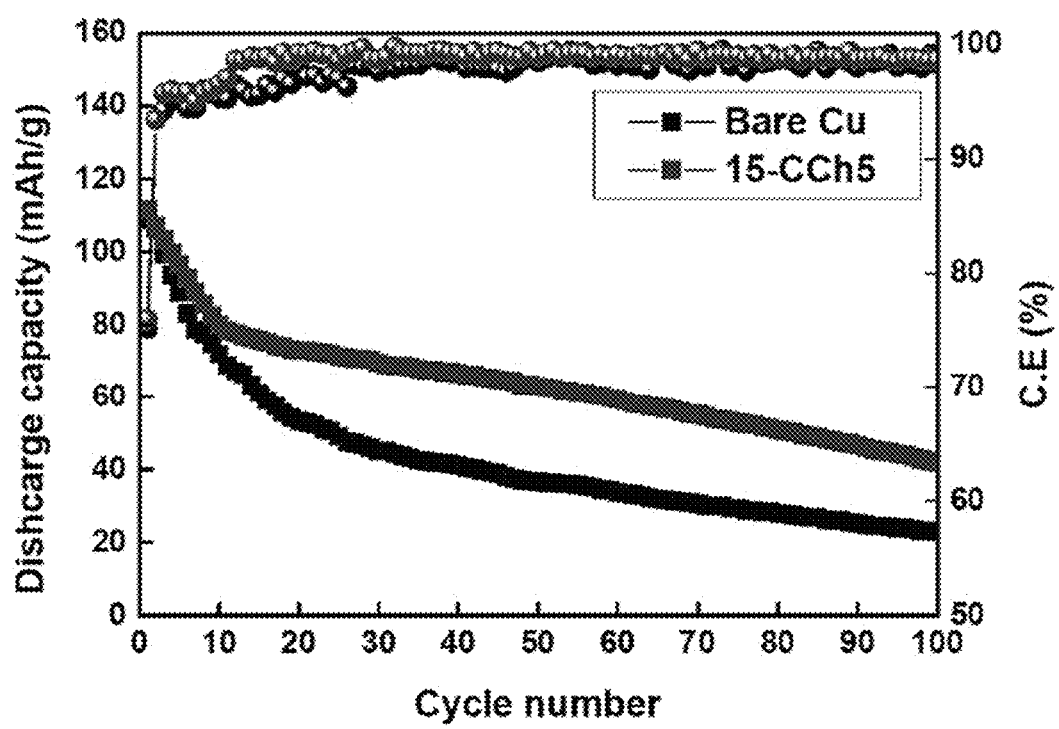

Fig. 15A
Fig. 15B
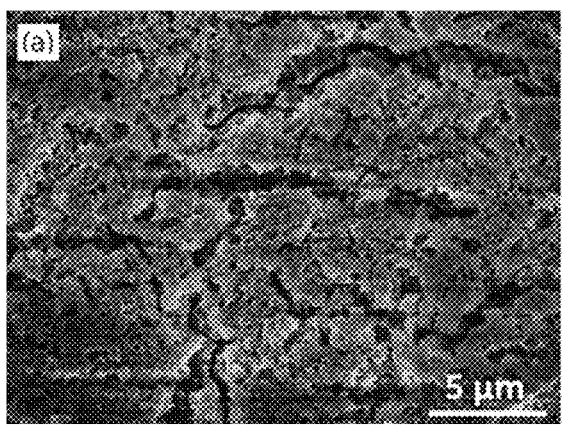
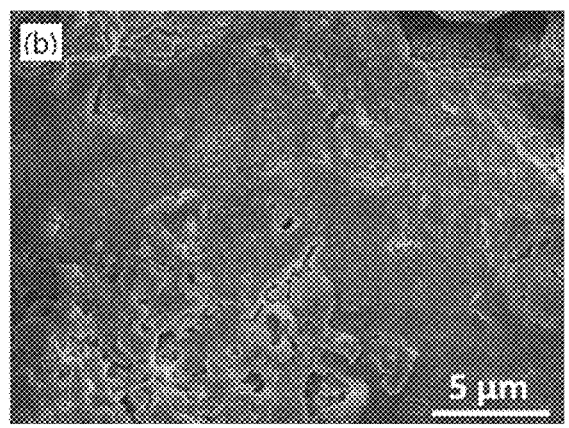

[Fig. 16]
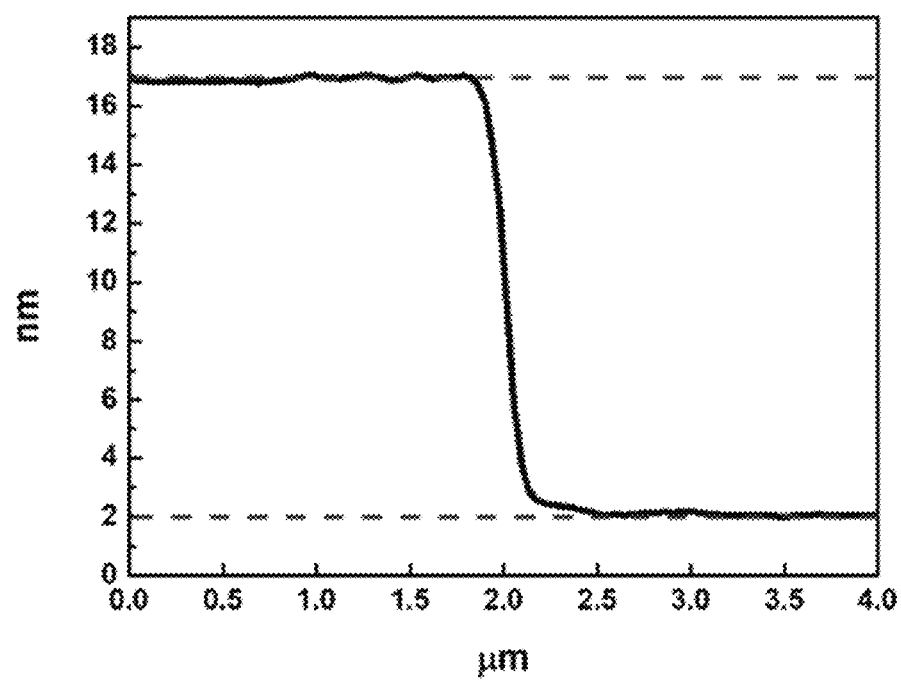

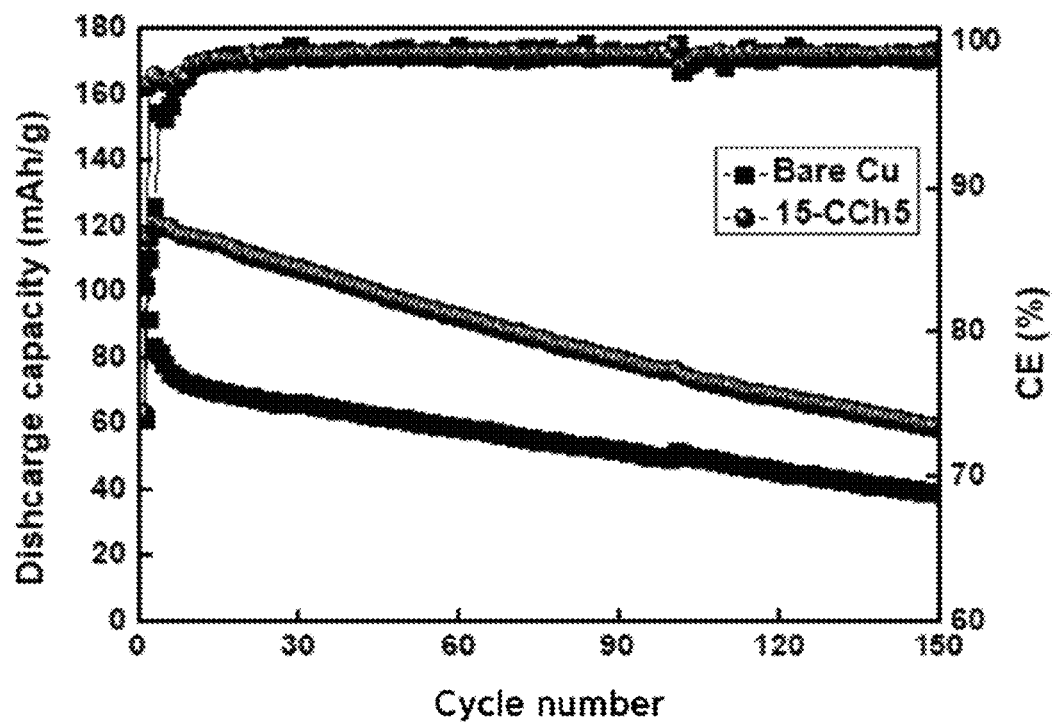
[Fig. 17]

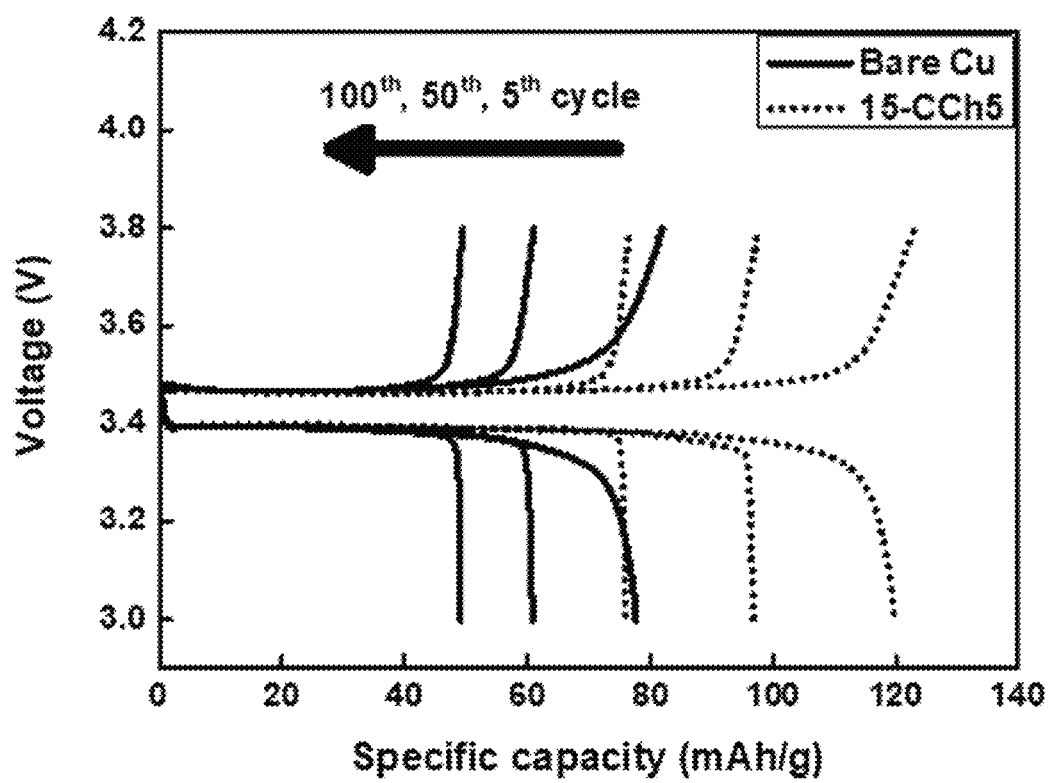
[Fig. 18]

Fig. 19A
Fig. 19B
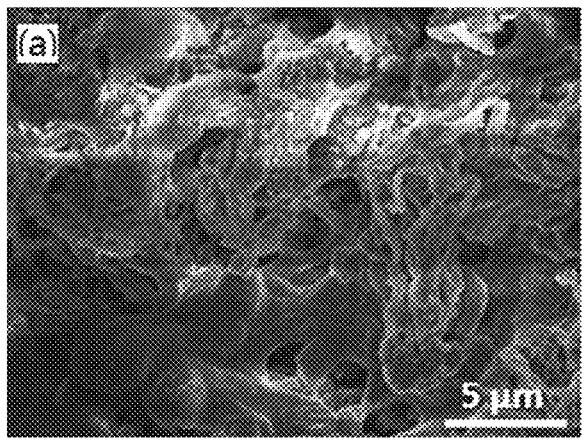
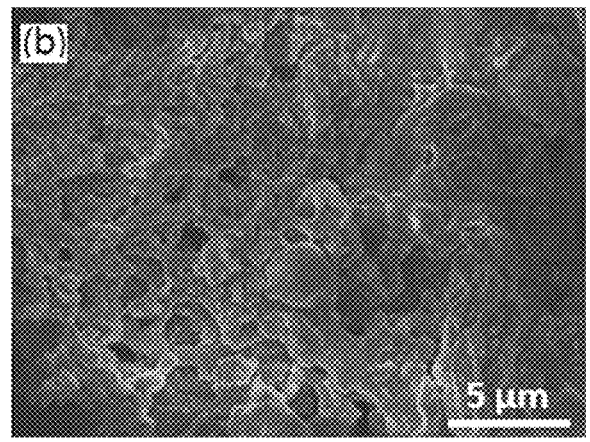

ANODE-FREE RECHARGEABLE LITHIUM BATTERY INCLUDING TRANSITION METAL DICHALCOGENIDE LAYER AND METHOD OF MANUFACTURING SAME

CROSS REFERENCE TO RELATED APPLICATION

The present application claims priority to Korean Patent Application No. 10-2021-0096212, filed Jul. 22, 2021, the entire contents of which is incorporated herein for all purposes by this reference.

BACKGROUND OF THE INVENTION

1. Field of the Invention

The present invention relates to an anode-free lithium battery including an ion conductive layer and a transition metal dichalcogenide layer.

2. Description of the Related Art

Recently, as electric vehicles and other large-scale electric products have been developed rapidly, the demand for high-density lithium secondary batteries has grown. Currently, graphite anodes used in commercial lithium-ion batteries have a low capacity per weight (for example, 372 mAh/g of $LiC_6$). Therefore, it is naturally difficult to develop a high-energy-density and light-weight battery.

Among many alternatives to graphite anodes, lithium is being considered as one of the promising materials for next-generation batteries due to its high theoretical capacity (for example, 3,860 mAh/g) and the lowest standard reduction potential (−3.04V compared to the standard hydrogen electrode). However, regarding lithium metal batteries, it is yet difficult to use a lithium metal as an anode in practice due to problems such as large volume change, unstable SEI formation in electrolyte, and short-circuit caused by growth of dendrites.

In addition, excessive use of Li metal in lithium metal batteries may cause a reduction in energy density per volume and safety issues. For this reason, recently, an anode-free rechargeable lithium battery (AFLMB) system is attracting attention as a solution to the problems of the conventional lithium battery system.

The AFLMB system uses a mechanism in lithium plating and stripping is performed a current collector without an anode active material during charging and discharging, respectively. In this case, since there is no anode active material on the anode side, the energy density is higher and the manufacturing method is simpler than conventional lithium batteries.

However, since there is no anode active material, there is a problem of low Coulombic efficiency and instability in cycle performance due to dendrite growth during plating.

In addition, the copper current collector requires a high activation energy level or a high overpotential for lithium nucleation, which causes unstable lithium plating, leading to the growth of an undesirable morphology called dead lithium and the growth of dendrite.

To overcome this problem, many studies have been conducted in two ways: SEI optimization, and current density reduction through surface area increase.

For the SEI optimization, there was an approach to use an artificial SEI coating layer and to adjust the composition of an electrolyte, and for the surface area increase, there was an approach to modify the three-dimensional structure of the current collector.

In such an attempt, there were cases of using organic and inorganic materials and 2D materials such as multilayer graphene and h-BN as coating materials.

In addition, there were cases of adjusting the electrolyte to form a stable SEI, for example, by using a solid electrolyte instead of a liquid electrolyte, increasing the concentration of a lithium salt, inventing a new solvent, using a double salt, or applying an additive. In addition, there were cases where Cr, Ni, or Li alloy was used to replace copper as a material for a current collector and the three-dimensional structure of the current collector was modified to increase the electroactive surface or to increase the capacity to accept and retain lithium. However, a perfect solution to the problems has not yet been found, and thus further research and development are required to solve the problems.

The present invention relates to an anode-free lithium battery, and more particularly and is intended to provide a negative electrode current collector having a structure in which a copper foil is coated with a thin $PdTe_2$ film that lowers nucleation overpotential. The present invention is intended to provide an anode-free rechargeable lithium battery further including an LiPON layer formed on the negative electrode current collector, thereby effectively inhibiting the growth of dendrites.

DOCUMENTS OF RELATED ART

Patent Document (Patent Document 1) Korean Patent Application Publication No. 10-2019-0083877 (Jan. 5, 2018)

Non-Patent Document (Non-patent Document) Eunho Cha et al., "2D MoS2 as an efficient protective layer for lithium metal anodes in high-performance Li—S batteries", Nature Nanotechnology, 2018, vol. 13, 337-344.

(Non-patent Document 2) Weiwen Wang et al., "Lithium phosphorus oxynitride as an efficient protective layer on lithium", Energy storage materials 2019, vol. 18, 414-422.

SUMMARY OF THE INVENTION

To solve the above problems, the objective of the present invention is to provide an anode-free lithium metal battery including a transition metal dichalcogenide layer.

A first aspect of the present invention for achieving the above objective relates to an anode-free lithium metal battery.

In the first aspect, the anode-free lithium metal battery may include a transition metal dichalcogenide layer.

In the first aspect, the transition metal dichalcogenide layer may be made of a material satisfying the chemical formula "$MX_2$", in which M is a transition metal, and X is any one selected from among S, Se, and Te.

In the first aspect, the transition metal may be any one selected from among Ni, Pd, Pt, Cu, Ag, and Au.

In the first aspect, the transition metal dichalcogenide layer has a thickness in a range of 2 to 20 nm.

A second aspect of the present invention relates to a method of manufacturing a negative electrode current collector for an anode-free lithium metal battery.

In the second aspect, the negative electrode current collector may be obtained by forming a transition metal dichalcogenide layer through deposition on a copper foil.

In the second aspect, heat treatment and the deposition may be concurrently performed.

In the second aspect, the heat treatment may be performed at a temperature in a range of 150° C. to 250° C.

In the second aspect, a time for the heat treatment may be longer than a time for the deposition.

The anode-free lithium metal battery including the transition metal dichalcogenide layer and the ion conductive layer, according to the present invention, can be more stably charged and discharged than a conventional liquid electrolyte battery, thereby having a significantly prolonged lifespan.

BRIEF DESCRIPTION OF THE DRAWINGS

FIG. 1 is a schematic diagram illustrating a negative electrode-side structure of an anode-free lithium metal battery according to one embodiment of the present invention;

FIG. 4 is a graph showing the results of measurement of nucleation overpotential of a negative electrode current collector for an anode-free lithium metal battery according to one embodiment of the present invention when current is supplied at a current density of 0.1 mA/cm$^2$;

FIG. 5 is a graph illustrating charge and discharge results for a half cell that is charged using a negative electrode current collector for an anode-free lithium metal battery, according to one embodiment of the present invention, and lithium as a working electrode and a counter electrode, respectively, at a current density of 1 mA/cm$^2$;

FIG. 6 is a graph illustrating the results of electrochemical impedance spectroscopy (EIS) for a half cell using a negative current collector for an anode-free lithium metal battery, according to one embodiment of the present invention, and lithium as a working electrode and a counter electrode, respectively;

FIG. 7 is a graph illustrating the Coulombic efficiency of each charge/discharge cycle of 100 charge/discharge cycles for a half cell using a negative current collector for an anode-free lithium metal battery, according to one embodiment of the present invention, and lithium as a working electrode and a counter electrode, respectively;

FIG. 8 is a voltage hysteresis graph illustrating the voltage difference between a charge curve and a discharge curve for 100 charge/discharge cycles for a half cell that is charged using a negative electrode current collector for an anode-free lithium metal battery, according to one embodiment of the present invention, and lithium as a working electrode and a counter electrode, respectively;

Figure 2A:
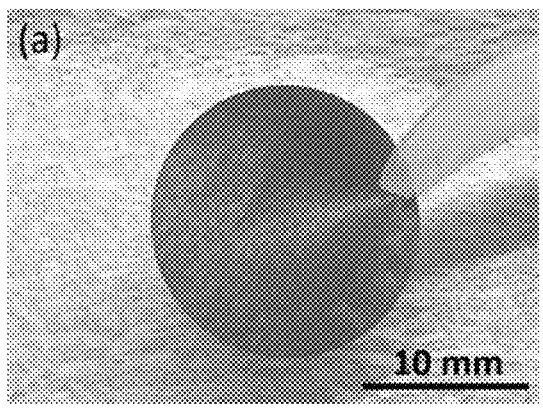
FIG. 2A is a photograph of a copper-based negative electrode current collector.
Figure 14A:
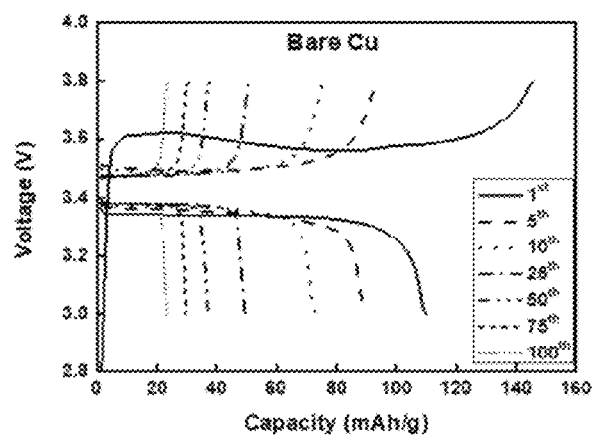
Figure 14B:
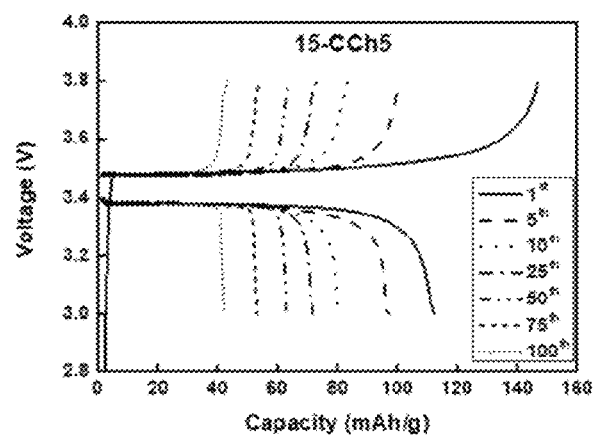

(a) of FIG. 9 is a SEM image of a cross section of a copper-based negative electrode current collector after 100 charge/discharge cycles for a half cell in which the copper-based negative electrode current collector and lithium are used as a working electrode and a counter electrode, respectively;

(b) of FIG. 9 is a SEM image of a cross section of a negative electrode current collector after 100 charge/discharge cycles for a half cell in which the negative electrode current collector and lithium for an anode-free lithium metal battery according to one embodiment of the present invention and lithium are used as a working electrode and a counter electrode, respectively;

(c) of FIG. 9 is a SEM image of the surface of a copper-based negative electrode current collector after 100 charge/discharge cycles for a half cell in which the copper-based negative electrode current collector and lithium are used as a working electrode and a counter electrode, respectively;

(d) of FIG. 9 is a SEM image of the surface of a negative electrode current collector after 100 charge/discharge cycles for a half cell in which the negative electrode current collector and lithium for an anode-free lithium metal battery according to one embodiment of the present invention and lithium are used as a working electrode and a counter electrode, respectively;

(e) of FIG. 9 is a SEM image of the surface of a copper-based negative electrode current collector after 100 charge/discharge cycles for a half cell in which the copper-based negative electrode current collector and lithium are used as a working electrode and a counter electrode, respectively;

(f) of FIG. 9 is a SEM image of the surface of a negative electrode current collector after 100 charge/discharge cycles for a half cell in which the negative electrode current collector according to one embodiment of the present invention and lithium are used as a working electrode and a counter electrode are used, respectively;

FIG. 10 is a graph illustrating an XRD measurement result of a negative electrode current collector for an anode-free lithium metal battery according to one embodiment of the present invention;

FIG. 11 is a graph illustrating the Coulombic efficiency of each charge/discharge cycle of 100 charge/discharge cycles performed at a current density of 1 mA/cm$^2$ for a half cell in which a negative electrode current collector for an anode-free lithium metal battery according to one embodiment of the present invention and lithium are used as a working electrode and a counter electrode, respectively;

FIG. 12 is a graph illustrating the Coulombic efficiency of each charge/discharge cycle of 100 charge/discharge cycles performed at a current density of 1 mA/cm$^2$ for a half cell in which a negative electrode current collector for an anode-free lithium metal battery according to one embodiment of the present invention and lithium are used as a working electrode and a counter electrode, respectively;

FIG. 13 is a graph illustrating the discharge capacity and Coulombic efficiency after 100 charge/discharge cycles for a half cell in which a negative electrode current collector for an anode-free lithium metal battery according to one embodiment of the present invention and lithium are used as a working electrode and a counter electrode, respectively;

FIG. 14A is a charge/discharge graph of an anode-free lithium metal battery including a copper-based negative electrode current collector;

FIG. 14B is a charge/discharge graph of an anode-free lithium metal battery according to one embodiment of the present invention;

FIG. 15A is a SEM image of the surface of a lithium layer plated on a copper-based negative electrode current collector of an anode-free lithium metal battery including the copper-based negative electrode current collector, the SEM image being taken after 100 charge/discharge cycles of the battery;

FIG. 15B is a SEM image of the surface of a lithium layer plated on a negative electrode current collector after 100 charge/discharge cycles of an anode-free lithium metal battery according to one embodiment of the present invention;

FIG. 16 is a graph illustrating the thickness of a $PdTe_2$ layer deposited on a silicon wafer, the thickness being measured with an atomic force microscope (AFM);

FIG. 17 is a graph illustrating the discharge capacity and the Coulombic efficiency an anode-free lithium metal battery according to one embodiment of the present invention after 100 charge/discharge cycles of 0.2 C-rate;

FIG. 18 is a 0.2 C-rate charge/discharge graph of an anode-free lithium metal battery according to one embodiment of the present invention;

FIG. 19A is a SEM image of the surface of a negative electrode current collector after 100 charge/discharge cycles for an anode-free lithium metal battery in which a copper-based negative electrode current collector and lithium are used as a working electrode and lithium as a counter electrode, respectively; and FIG. 19B is a SEM image of the surface of a negative electrode current collector after 100 charge/discharge cycles for an anode-free lithium metal battery according one an embodiment of the present invention.

DESCRIPTION OF THE PREFERRED EMBODIMENTS

Hereinafter, an anode-free lithium metal battery according to the present invention will be described in detail. The following drawings are provided as examples to sufficiently convey the spirit of the present invention to those skilled in the art. Accordingly, the present invention is not limited to the drawings and may be embodied in other forms, and the drawings presented below may be exaggerated to clarify the spirit of the present invention. In the flowing description, unless otherwise defined, all terms including technical and scientific terms used herein have the same meaning as commonly understood by those who are ordinarily skilled in the art to which this invention belongs. Further, when it is determined that the detailed description of the known art related to the present invention might obscure the gist of the present invention, the detailed description thereof will be omitted.

The present invention provides an anode-free lithium metal battery to solve the problems described above. The anode-free lithium metal battery includes a cathode, a negative electrode current collector, an electrolyte, and a separator. The negative electrode current collector includes a copper foil.

In the present invention, the negative electrode current collector includes a transition metal dichalcogenide layer. The transition metal dichalcogenide layer is made of a material satisfying the formula "$MX_2$", in which M is a transition metal selected from among Ni, Pd, Pt, Cu, Ag, and Au, and X is any one selected from among S, Se, and Te. The use of such a material increases the adhesion between the dichalcogenide layer and the copper foil and improves the electronic conductivity.

In this case, preferably, the transition metal is Pd, and the X is Te. The use of the materials lowers the overpotential of a lithium reduction reaction, thereby inducing a nucleation reaction.

The transition metal dichalcogenide layer has a thickness of 2 to 20 nm. The thickness is preferably in a range of 5 to 18 nm and more preferably in a range of 10 to 16 nm. When the thickness is in that range, the growth of lithium dendrites is inhibited, thereby preventing the formation of an inactive lithium aggregate commonly called dead lithium.

In this case, the negative electrode current collector may further include an intermediate layer. The intermediate layer may be formed by metallic bonding between the negative electrode current collector and the transition metal dichalcogenide.

Specifically, the intermediate layer is formed by metaling bonding between the X and copper constituting the transition metal dichalcogenide. A portion of the transition metal dichalcogenide is converted into MX so that an intermediate layer made of CuX is formed. The anode-free lithium metal battery provided in the present invention has a prolonged lifespan compared to conventional counterparts due to the presence of the intermediate layer.

In addition, the negative electrode current collector provided in the present invention includes an artificial SEI on the negative electrode current collector. In this case, the artificial SEI contains lithium phosphorous oxynitride (LiPON). Specifically, the chemical formula of the lithium phosphorous oxynitride may be $Li_aP_bO_cN_d$ (1.5≤a≤8.0, 1.0≤b≤3.0, 2.0≤c≤8.0, 0.4≤d≤2.0, and a, b, c, and d are real numbers). Due to the presence of the artificial SEI, it is possible to prevent SEI destruction attributable to non-uniform lithium plating, thereby preventing lithium from growing as an unstable form such as dendrite.

The cathode includes a positive electrode active material, a positive electrode current collector, a conductive material, and a binder. For the current collector, the conductive material and the binder, materials that are known to be used for the purposes thereof may be used without particular limitation.

The positive electrode active material includes, but is not limited to, any one lithium transition metal oxide or a mixture of two or more lithium transition metal oxides selected from the group consisting of $LiCoO_2$, $LiMnO_2$, $LiNiO_2$ $LiMn_2O_4$, $LiNi_{1-x}Co_xO_2$, $LiNi_xCo_yMn_zO_2$ (x+y+z=1), $LiNi_xCo_yAl_zO_2$ (x+y+z=1), $LiNi_xMn_yMt_zO_2$ (x+y+z=1, Mt is a divalent or trivalent transition metal), $LiFePO_4$, $LiMnPO_4$, $LiCoPO_4$, $LiFe_{1-x}Mt_xPO_4$ (Mt is a transition metal), a $(Li_2MnO_3)b(LiNi_xCo_yMn_zO_2)$ (a+b=1, x+y+z=1), $Li_{1.2}Ni_{0.13}Co_{0.13-x}Mn_{0.54}Al_xO_{2(1-y)}F_{2y}$ (x and y are each independently a real number in a range of 0 to 0.05), $Li_{1.2}Mn_{(0.8-a)}Mt_aO_2$ (Mt is a divalent or trivalent transition metal), $Li_2Nti_{1-x}Mt_xO_3$ (Nt is a divalent, trivalent, or quadrivalent transition metal, and Mt is a divalent or trivalent transition metal), $Li_{1+x}Nt_{y-z}Mt_zO_2$ (Nt is Ti or Nb, and Mt is V, Ti, Mo, or W), $Li_4Mn_{2-x}Mt_xO_5$ (Mt is a metal or a transition metal), $Li_xMt_{2-x}O_2$ (Mt is a transition metal such as Ti, Zr, Nb, or Mn), $Li_2O/Li_2Ru_{1-x}Mt_xO_3$ (Mt is a transition metal such as Ti, Zr, Nb, or Mn.

The positive electrode current collector provides an electrical path between the powdered positive electrode active material and the power source, and the positive electrode current collector may be made of an aluminum material in the form of an aluminum foil or an aluminum mesh.

The conductive material is used to impart conductivity to the electrode. As the conductive material, a material that does not cause chemical change and has electronic conductivity is used. Specific examples thereof include: carbon-based materials such as graphite, carbon black, Super P, acetylene black, Ketjenblack®, channel black, furnace black, lamp black, summer black, carbon fiber, carbon nanotube, carbon nanowire, graphene, graphitized mesocarbon microbead, fullerene, and amorphous carbon; metal powders or metal fibers of copper, nickel, aluminum, and silver; conductive whiskers such as zinc oxide and potassium titanate; conductive metal oxides such as titanium oxide; conductive polymers such as polyphenylene derivatives, and the like. One of the exemplary materials or a mixture of two or more materials selected from the exemplary materials may be used, but the conductive material is not necessarily limited thereto.

The binder imparts adhesion between the active material and the conductive material particles. Specific examples of the binder include polyvinylidene Fluoride (PVdF), polyimide (PI), fluoropolyimide (FPI), polyacrylic acid (PAA), polyvinyl alcohol (PVA), carboxymethylcellulose (CMC), starch, hydroxypropyl cellulose, recycled cellulose, polyvinylpyrrolidone (PVP), tetrafluoroethylene (PTFE), polyethylene, polypropylene, pulleyurethane, ethylene-propylene-diene polymer (EPDM), sulfonated ethylene-propylene-diene polymer (S-EPDM), styrene-butadiene rubber (SBR), fluoro rubber or copolymers thereof, and algins. One material or a mixture of two or more materials selected from the examples may be used, but the material used as the binder is not necessarily limited thereto.

The electrolyte may be a lithium salt, a mixed organic solvent containing the same, a polymer matrix, or an all-solid electrolyte.

The lithium salt is any one salt or a mixture of two or more salts selected from the group consisting of $LiPF_6$, $LiClO_4$, $LiAsF_6$, $LiBF_4$, $LiSbF_6$, $LiAlO_4$, $LiAlCl_4$, $LiCF_3SO_3$, $LiC_4F_9SO_3$, $LiC_6H_5SO_3$, $LiN(C_2F_5SO_3)_2$, $LiN(C_2F_5SO_2)_2$, $LiN(CF_3SO_2)_2$, $LiN(FSO_2)_2$, $LiN(C_xF_{2x+1}SO_2)*(C_yF_{2y+1}SO_2)$ (here, x and y are each 0 or a natural number), LiCl, LiI, LiSCN, $LiB(C_2O_4)_2$, $LiF_2BC_2O_4$, $LiPF_4(C_2O_4)$, $LiPF_2(C_2O_4)_2$, and $LiP(C_2O_4)_3$. However, the lithium salt is not limited thereto.

The mixed organic solvent may be may be any one or a mixture of two or more ones selected from: the group consisting of cyclic carbonates such as ethylene carbonate, propylene carbonate, and vinylene carbonate; the group consisting of linear carbonates such as dimethyl carbonate, methyl ethyl carbonate, and diethyl carbonate; the group consisting of ethers such as dimethyl ether, ethyl methyl ether, diethyl ether, propyl methyl ether, propyl ethyl ether, dipropyl ether, isopropyl methyl ether, isopropyl ethyl ether, diisopropyl ether, n-butyl methyl ether, n-butyl ethyl ether, n-butyl propyl ether, n-butyl isopropyl ether, n-dibutyl ether, tert-butyl methyl ether, tert-butyl ethyl ether, tert-butyl propyl ether, tert-butyl isopropyl ether, tert-dibutyl ether, ethylene glycol methyl ether, ethylene glycol ethyl ether, ethylene glycol propyl ether, ethylene glycol isopropyl ether, ethylene glycol n-butyl ether, ethylene glycol tert-butyl ether, diethylene glycol ether, propylene glycol methyl ether, propylene glycol ethyl ether, Propylene glycol propyl ether, propylene glycol isopropyl ether, propylene glycol n-butyl ether, propylene glycol tert-butyl ether, and dipropylene glycol ether; and fluorinated substituents or derivatives thereof. However, the mixed organic solvent is not limited thereto.

The mixed organic solvent may further include an additive.

The additive may be a material serving to aid the formation of a cathode-electrolyte interface. Specifically, the additive may be any one or a mixture of two or more ones selected from the group consisting of boron-based materials such as trimethyl boroxine (TMB), triethyl boroxine, trimethyl borate, triethyl borate (TEB), tris(trimethylsilyl) borate (TMSB), lithium trifluoro(perfluoro-tert-butyloxyl) borate (LiTPBOB), and lithium difluoro(oxalato) borate (LiDFOB); the group consisting of sulfur-based materials such as 4,4-bi(1,3,2-dioxathiolane)2,2-dioxide (BDTD) and 2-(2,2,2-trifluoroethoxy)-1,3,2-dioxaphospholane-2-oxide (TFEOP); and the group consisting of fluorinated series in which methyl 2,2,2-trifluoroethyl carbonate (FEMC), methyl difluroacetate (DFMAc), or ethyl difluoroacetate (DFEAc) are used in combination with fluoroethylene carbonate (FEC). However, the additive may not be limited thereto, and any additive known to assist the formation of CEI may be used.

The additive may be a material serving to directly form a solid-electrolyte interface (SEI) or aids the formation of the SEI. Specifically, the additive may be any one or a mixture of two or more selected from among: the group consisting of fluoroethylene carbonate (FEC), vinylene carbonate (VC), vinylethylene carbonate (VEC), allylethyl carbonate, vinyl acetate, divinyl adipate, acrylic acid nitrile, 2-vinyl pyridine, γ-butyrolactone (GBL), methylphenyl carbonate (methyphenyl carbonate), succinic imide, maleic anhydride, methyl chloroformate, methyl cinnamate, and cyclic compounds such as furan derivatives having a double bond; the group consisting of phosphonate compounds; the group consisting of vinyl-containing silane compounds; and the group consisting of nitrate and nitrite compounds. However, the additive is not necessarily limited thereto. Any material that is known to form the SEI or to aid the formation of the may be used without limitation. Specifically, as the additive, $LiNO_3$ capable of solving the problem of an unstable SEI which is a problem of conventional anode-free lithium metal batteries is preferably used.

The additive may be a material serving to prevent overcharging. Specifically, the additive may be any one or a combination of two or more ones selected from among: the group consisting of organic compounds such as metallocenes, tetracyano ethylene, tetramethyl phenylene diamine, dihydrophenazine, biphenyl carbonates, 2,7-diacetyl thianthrene, and phenothiazine; the group consisting of lithium salts such as fluorododecaborates ($Li_2B_{12}F_xH_{12-x}$) and lithium bis(oxalato)borate (LiBOB); and the group consisting of aromatic compounds such as xylene, cyclohexyl benzene, hexaethyl benzene, biphenyl, 2,2-diphenyl propane, 2,5-2,5-di-tert-butyl-1,4-dimethoxy benzene, phenyl-tert-butyl carbonate, anisole, difluoroanisole, and thiophene-3-acetonitrile. However, the additive is not necessarily limited thereto, and any material that is known to be capable of preventing overcharging may be used without any limitation as the additive.

The additive may be material serving to increase the flame retardancy of secondary batteries. Specifically, the additive may be any one or a mixture of two or more selected from among: the group consisting of alkyl phosphates such as trimethyl phosphate and triethyl phosphate; the group consisting of halogenated phosphates such as 2,2,2-tris(2,2,2-trifluoroethyl) phosphate; the group consisting of phosphazenes such as hexamethoxy cyclophosphazene; and the group consisting of fluorinated ethers such as methyl nonafluoro butyl ether (MFE) and fluorinated carbonates. However, the additive is not necessarily limited thereto, and any material that is known to be able to increase flame retardancy may be used without any limitation as the additive.

The additive may be a material added for uniform reduction deposition of lithium. Specifically, the additive may be any one or more selected from among tetrahydrofuran, 2-methyltetrahydrofuran, thiophene, 2-methylthiophene, nitromethane, tetra alkyl ammonium chloride, cetyl trimethyl ammonium chloride, lithium perfluoro octane sulfonate, tetra ethyl ammonium perfluoro octane sulfonate, perfluoro polyethers, $AlI_3$, and $SnI_2$.

The additive may be added to help the solvation of ions. The additive may be any one or more selected from among 12-crown-4 and derivatives thereof, tris(pentafluoro phenyl) borane, cyclic aza-ether compounds, and borole compounds.

The additive may be added to prevent corrosion of an aluminum current collector. Specifically, the additive may include a lithium salt compound having the chemical formula $LiN(SO_2C_nF_{2n+1})_2$ (n is a number in a range of 2 to 4).

The additive may be added in an amount of 0.01% to 10% by weight with respect to the weight of the electrolyte.

The concentration of the electrolyte made of the mixed organic solvent containing the lithium salt may be adjusted to a level commonly used in the art, and the concentration of the lithium salt is specifically in a range of 0.1 to 5 M and more preferably in a range of 0.5 to 1.5 M.

The electrolyte may include a polymer electrolyte matrix to improve mechanical properties or stability at high temperatures. The electrolyte may be any one material or a mixture of two or more materials selected from the group consisting of high molecular-weight polymers and copolymers thereof, such as polyacrylate, polymethacrylate, polyvinyledene fluoride (PVDF), polyhexafluoro propylene (PHFP), polyethylene oxide (PEO), polypropylene oxide (PPO), polydimethyl siloxane, polyacrylonitrile, and polyvinyl chloride (PVC), and PEGDME. Any high molecular weight polymers that have been used to manufacture lithium secondary batteries may be used as the electrolyte.

The polymer matrix may include crosslinking units for crosslinking with each other.

The all-solid electrolyte is a composite of the polymer matrix and the lithium salt that are mixed with each other, and the components constituting the same are the same as those of the polymer matrix and the lithium salt. Therefore, redundant descriptions thereof will be omitted.

The anode-free lithium metal battery may include a separator.

The separator may be a porous polymer membrane of any one of polyethylene and polypropylene, or a porous polymer membrane coated with a ceramic material.

In addition, the present invention provides a method of manufacturing a negative electrode current collector for an anode-free lithium metal battery. The method includes a step of forming a transition metal dichalcogenide layer through deposition on a copper foil.

Specifically, the method includes the steps of: (A) mixing M and X and heating the resulting mixture to obtain $MX_2$ alloy; (B) cooling the $MX_2$ alloy stepwise; (C) sintering the $MX_2$ alloy; and (D) depositing the $MX_2$ alloy on a copper foil to form the negative electrode current collector for an anode-free lithium metal battery.

The M is a transition metal selected from the group consisting of Ni, Pd, Pt, Cu, Ag, and Au, and the X is any one selected from the group consisting of Se and Te.

In step (A), the M and X may be mixed in an atomic ratio of 1:1 to 1:3. More preferably, the atomic ratio may be in a range of 1:1.5 to 1:2.5, may be more preferably in a range of 1:1.8 to 1:2.2, and may be most preferably 1:2. When mixed in that range, it is easy for the deposited layer to appear in a dichalcogenide form.

In step (A), heating may be performed in a vacuum-sealed state in which the pressure is in a range of $10^{-3}$ to $10^{-5}$ torr. The heating reduces the content of impurities, resulting in improvement in electrical conductivity.

In step (A), the heating may be performed at a temperature in a range of 800° C. to 1200° C. for 12 to 36 hours. The heating may be performed at a temperature, preferably, in a range of 900° C. to 1100° C. and more preferably in a range of 950° C. to 1050° C. In addition, the heating is preferably carried out for 16 to 32 hours and more preferably carried out for 20 to 28 hours. When the heating is carried under such conditions, a dichalcogenide phase can be easily formed.

In step (A), the dichalcogenide alloy formed by the heating may be in the form of a powder.

In step (B), the cooling may include a first step in which the cooling is performed at a constant cooling rate and a second step in which natural air cooling is used.

In step (B), the first step may be a step of cooling the $MX_2$ alloy at from at a rate of 70° C./min to 130° C./min from the final temperature of step A to a temperature of 400° C. to 600° C. In this step, the cooling rate is preferably in a range of 75° C./min to 125° C./min and more preferably in a range of 80° C./min to 120° C./min. The alloy is preferably cooled down to a temperature of 425° C. to 575° C. and more preferably to a temperature of 450° C. to 550° C. The slow cooling performed at such a rate has the effect of preventing phase separation and delamination of the alloy that may occur due to rapid cooling.

In step (B), the second step may be natural air cooling from the final temperature of step (A) to room temperature. Unlike step (A), since the temperature is relatively low in step (B), phase separation and delamination do not occur even during the natural air cooling.

In step (C), the sintering may be performed by a spark plasma sintering method, an atmospheric pressure sintering method, or an isostatic pressure sintering method. In this case, it is preferable to use a spark plasma sintering method. The sintering may be performed at a temperature in a range of 300° C. to 500° C. for 30 to 90 minutes at a pressure of 1 to 3 kPa in an argon atmosphere. The sintering is preferably carried out at a temperature in a range of 340° C. to 460° C. and more preferably carried out at a temperature in a range of 360° C. to 420° C. In addition, the sintering is preferably carried out for 40 to 80 minutes and more preferably for 45 to 75 minutes. The sintering performed under the conditions increases the density of the alloy, thereby increasing the yield and efficiency of the deposition process.

In step (C), through the sintering, the dichalcogenide alloy may be converted from a powder form to a disk form having a diameter of 4 to 6 cm. When the dichalcogenide alloy having undergone the sintering is used as a sputtering target, the deposition efficiency is increased.

In step (D), the deposition may be performed by sputtering or atomic layer deposition. The sputtering is more preferably in terms of maintaining the dichalcogenide structure through the deposition.

The sputtering method may be performed in a state in which argon is supplied at a pressure of $1 \times 10^{-3}$ to $9 \times 10^{-3}$ Torr while reducing the pressure to a base pressure of $1.0 \times 10^{-6}$ to $8.0 \times 10^{-6}$ Torr. Preferably, the pressure may be reduced to a base pressure range of $2.0 \times 10^{-6}$ to $7.0 \times 10^{-6}$ Torr and more preferably in a base pressure range of $3.0 \times 10^{-6}$ to $6.0 \times 10^{-6}$ Torr. In addition, argon is supplied preferably at a pressure of $2 \times 10^{-3}$ to $8 \times 10^{-3}$ Torr and more preferably at a pressure of $3 \times 10^{-3}$ to $7 \times 10^{-3}$ Torr. When the spurring is performed under the conditions described above, it is possible to easily obtain a deposition surface with a small gradient.

When the deposition is performed for the formation of the negative electrode current collector for an anode-free lithium metal battery provided in the present invention, heat treatment is concurrently performed. The heat treatment may be performed at a temperature in a range of 150° C. to 250° C. Through the heat treatment, a CuTe layer, which is an intermediate layer, is formed.

In the manufacturing method, the duration for the heat treatment is 1 to 15 minutes longer than the duration for the deposition time. Specifically, in the method of manufacturing the negative electrode current collector for an anode-free lithium metal battery provided in the present invention, a secondary heat treatment is performed for 1 to 15 minutes at the same temperature as the heat treatment described above. This secondary heat treatment improves the electronic conductivity of the PdTe$_2$ layer and the CuTe layer, thereby inhibiting the growth of lithium dendrites.

In step (D), the negative electrode current collector may further include an artificial SEI that is formed after the deposition. The artificial SEI may contain LiPON. The detailed composition of the artificial SEI is the same as that described above, and thus a redundant description thereof will be omitted.

In step (D), the artificial SEI may be deposited by sputtering. The sputtering is performed in a nitrogen gas atmosphere while using Li$_x$P$_y$O$_z$ (x, y, and z are real numbers satisfying the conditions of 1.5≤x≤8.0, 1.0≤y≤3.0, and 2.0≤z≤8.0, respectively) as a sputtering target.

Hereinafter, an anode-free lithium metal battery and a method for manufacturing the same according to the present invention will be described in more detail with reference to examples. However, the following examples are presented only for illustrative purposes, and thus the present invention is not limited thereto and may be implemented in other forms.

Further, unless otherwise defined, all technical and scientific terms have the same meaning as commonly understood by one of ordinary skill in the art to which this invention belongs. The terminology used herein is for the purpose of effectively describing specific embodiments only and is not intended to limit the invention. In addition, unless otherwise defined, the unit of additives used in the invention is weight %.

Example 1

Pd and Te were weighed such that the atomic ratio of Pd:Te was 34:66. The prepared Pd and Te were put into a sealed quartz tube having a vacuum pressure of $10^{-3}$ to $10^{-5}$ torr and the temperature of the quartz tube was raised to 1000° C. The Pd and Te ware allowed to react each other at the raised temperature for 24 hours to form alloy, followed by cooling to a temperature of 500° C. at a cooling rate of 100° C./min and then by natural air cooling to room temperature, to prepare a PdTe$_2$ alloy. Next, the PdTe$_2$ alloy was plasma-sintered at a temperature of 380° C. and a pressure of 2 kPa for 40 minutes.

The PdTe$_2$ alloy was deposited on a copper foil under application of a DC power of 40 W under conditions in which the base pressure was adjusted to $4 \times 10^{-6}$ Torr and the partial pressure of argon gas was controlled to be $5 \times 10^{-3}$ Torr using a magnetron sputtering apparatus. While the deposition was performed, a substrate on which the resulting deposition film was formed was heated to 200° C. An additional heat treatment was performed for 5 minutes after the completion of the deposition to prepare a negative electrode current collector for an anode-free lithium metal battery.

Examples 2 to 12

All processes were performed in the same manner as in Example 1 except that the thickness of a deposition layer, whether heating was performed during deposition, and an additional heating time were changed as shown in Table 1 below.

Example 13

All processes were performed in the same manner as in Example 1. In this example, a radio frequency (RF) sputtering device was used, a base pressure was set to $4 \times 10^{-6}$ Torr, a nitrogen gas partial pressure was controlled to be $5 \times 10^{-3}$ Torr, and 100 W of RF power was applied. LiPON was deposited on a PdTe$_2$ layer using a Li$_3$PO$_4$ target.

Comparative Example 1

A copper foil was prepared as a negative electrode current collector.

TABLE 1

| | Deposition Thickness (nm) | With or without heat treatment (200° C.) during deposition | Additional heating time (min) | With or without CuTe layer |
|---|---|---|---|---|
| Example 1 | 15 | ○ | 5 | ○ |
| Example 2 | 9 | ○ | 5 | ○ |
| Example 3 | 6 | ○ | 5 | ○ |
| Example 4 | 15 | ○ | 10 | ○ |
| Example 5 | 9 | ○ | 10 | ○ |
| Example 6 | 6 | ○ | 10 | ○ |
| Example 7 | 15 | ○ | — | ○ |
| Example 8 | 9 | ○ | — | ○ |
| Example 9 | 6 | ○ | — | ○ |
| Example 10 | 15 | X | — | X |
| Example 11 | 9 | X | — | X |
| Example 12 | 6 | X | — | X |
| Example 13 | 15 | ○ | 5 | ○ |
| Comparative Example 1 | — | X | — | X |

Next, CR2032 coin cells were prepared to compare the electrochemical performance of the negative electrode current collectors prepared according to Examples 1 to 12 and Comparative Example 1. The coin cells were assembled in a glove box in an argon atmosphere with an oxygen concentration of O$_2$<1 ppm and a moisture content of H$_2$O<1 ppm.

For an electrolyte in each of the examples and comparative example, a 1 M solution prepared by mixing lithium bis-(trifluoromethane sulfonyl) imide (Li-TFSI) and a mixture of 1-3-dioxolane (DOL) and dimethyl ether (DME) mixed in a 1:1 volume ratio, and LiNO$_3$ was added, as an additive, in an amount of 2 wt. % with respect to the weight of the electrolyte. In addition, as a separator of each of the batteries, Celgard 2400 was used.

As the counter electrode of each of the half cells, a circular lithium metal film with a thickness of 200 μm and a diameter of 18 mm was used.

The half cells were pre-cycled 5 times with a voltage of 0 and 0.5V and a current density of 50 µA/cm².

As the cathode of each of the full cells, LiFePO$_4$ (LFP) which had been widely used was used, and specifically LFP, carbon black, and polyvinylidene fluoride (PVDF) was mixed in a mass ratio of 8:1:1 to prepare the cathode. The capacity per unit area of the cathode was 0.76 mAh/cm², and was processed to have a diameter of 14 mm.

The full cells were pre-cycled 5 times at 0.2 C-rate.

[Characteristic Evaluation Method]

A. Electrochemical Performance Evaluation of Half Cell

After pre-cycling a half-cell following the method described above, current was supplied at a current density of 0.1 mA/cm² to observe a nucleation overpotential. The results are shown in FIG. 4.

Charge and discharge curves measured during charging and discharging at a current density of 1 mA/cm² are shown in FIG. 5.

The electrochemical impedance was measured after the pre-cycle and after the completion of 100 cycles of charging and discharging, and the results are shown in FIG. 6. The electrochemical impedance measurement was performed in a frequency range from 1 MHz to 100 mHz with an amplitude of 5 mV at room temperature.

Thereafter, the Coulombic efficiency of the half cell was calculated according to Equation 1 when the half cell is charged and discharged at a current density of 1 mA/cm², and the results are shown in FIG. 7.

The Coulombic efficiency (%)=[discharge capacity (mAh)/charge capacity (mAh)]×100    <Equation 1>

The voltage difference between the average charging voltage and the average discharging voltage shown in the charging/discharging curve was calculated according to Equation 2 below, and the resulting voltage hysteresis occurring during charging and discharging is shown in FIG. 8.

Voltage hysteresis (mV)=(average discharging voltage)−(average charging voltage)    <Equation 2>

Referring to FIG. 4, it can be seen that the nucleation overpotential in the case of Example 1 in which PdTe$_2$ was deposited, heat treatment was performed during the deposition, and an addition heat treatment after the deposition was performed was reduced by 20 mV or more, compared to the copper negative electrode current collector of Comparative Example 1. The reduced the nucleation overpotential facilitates the generation of lithium nuclei and increases the density of lithium nuclei on the current collector, thereby preventing lithium from growing in a dendrite shape or a fractal shape during lithium plating.

Referring to FIG. 5, in the case of Comparative Example 1, the discharge capacity decreases as the cycle progresses. Specifically, the voltage unstably oscillates in the 100th cycle. Such a phenomenon may be caused by a temporary short-circuit phenomenon of an electrode, which is attributable to an unstable electrode surface when an electrode active material directly participates in an oxidation-reduction reaction. Lithium metal batteries have experienced an event in which an electrode short-circuit occurs due to dendrite growth or an event in which dead lithium, which does not participate in electron movement inside a cell, is temporarily activated by due to growth, in a lithium layer having undergone reduction. However, neither is desirable in terms of the lifespan of a battery.

On the other hand, Example 1 shows little change in the discharge curve even at the 100th cycle and little change in the charge curve. Therefore, the battery of Example 1 is expected to have an improved battery lifespan.

Referring to FIG. 6, there is nearly no difference in bulk resistance and interfacial resistance which is represented by a semicircle between Example 1 and Comparative Example 1 at the initial stage of use of assembled batteries. However, after 100 cycles, the interfacial resistance of the battery of Comparative Example 1 is larger than that of Example 1. The interfacial resistance relates to a phenomenon of charge transfer between electrons and ions. The smaller the interfacial resistance is the easier the charge transfers, which is advantageous for high-speed charging and discharging and can lower the overpotential of the electrode.

Referring to FIG. 7, the Coulombic efficiency for 100 charge/discharge cycles of each of the batteries of Example 1 and Comparative Example 1 can be confirmed. The battery of Example 1 continuously maintains 90% or more of Coulombic efficiency for 100 cycles whereas the battery of Comparative Example 1 shows a rapid decrease in the Coulombic efficiency from the 50th cycle and finally exhibits about 70% after the 100th cycle. The low Coulombic efficiency means that the amount of oxidized lithium is smaller than the amount of reduced lithium, indicating that the amount of dead lithium, which is the reduced lithium that cannot function normally as an electrode material, increases.

Referring to FIG. 8, the voltage hysteresis of the battery of Example 1 is lower than that of Comparative Example 1 through all cycles. Voltage hysteresis is related to the overpotential that occurs during oxidation and reduction of lithium. The lower the voltage hysteresis, the lower the overpotential required for oxidation and reduction of lithium.

Referring to FIG. 11, the battery of Example 13 including an artificial SEI was able to maintain a Coulombic efficiency of 95% or more for 150 cycles, and the battery of Example 1 maintained a Coulombic efficiency of 95% or more for 100 cycles.

Referring to FIG. 12, when no heating was performed, the batteries of Comparative Examples 1 and Example 10 exhibited a decrease in the Coulombic efficiency from the 50$^{th}$ cycle and the 45$^{th}$ cycle, respectively, and the batteries of Examples 11 and 12 did not exhibit a decrease in the Coulombic efficiency until the 80$^{th}$ cycle but exhibited a significant decrease thereafter.

Next, in the case where heating was performed during the deposition but no additional heating was performed, the battery of Example 9 exhibited a sharp decrease in the Coulombic efficiency from the 80$^{th}$ cycle, and the batteries of Examples 7 and 8 showed a relatively stable efficiency until the 90$^{th}$ cycle but exhibited a decrease in the Coulombic efficiency after the 90$^{th}$ cycle.

Next, in the case where concurrent heating with the deposition and additional heating were performed, the batteries of Examples 2 and 5 exhibited a decrease in the Coulombic efficiency after the 70$^{th}$ cycle when Examples 2, 5, and 8 are compared. However, the batteries of Examples 1 and 4 exhibited a Coulombic efficiency of 90% or more for all cycles, and there is no section in which the Coulombic efficiency is particularly reduced. That is, these batteries exhibited very good Coulombic efficiency.

B. Electrochemical Analysis of Full Cell

A charge/discharge test was performed at 0.5 C-rate, and the Coulombic efficiency and the discharge capacity are shown in FIG. 13 and the charge and discharge curves are shown in FIGS. 14A and 14B.

In addition, a charge-discharge test was performed at a 0.2 C-rate, and the Coulombic efficiency and the discharge capacity are shown in FIG. 17, and the charge and discharge curve are shown in FIG. 18.

Referring to FIG. 13, Example 1 and Comparative Example 1 have similar Coulombic efficiencies in the form of full cells but have a large difference in the reduction in discharge capacity. Example 1 and Comparative Example 1 show a sharp decrease in discharge capacity until the 10th cycle. However, after the 10th cycle, Example 1 shows a sharp slope in the discharge capacity and exhibits a higher discharge capacity than Comparative Example 1. Comparative Example shows a gentle slope in the discharge capacity and exhibits a lower discharge capacity than Comparative Example for all cycles. Referring to FIG. 14, the decreasing trend of the discharge capacity can be more clearly confirmed.

Referring to FIG. 17, although the Coulombic efficiency is similar to that of the 0.5 C-rate charging and discharging case described above, Example 1 has a higher discharge capacity for all cycles. Referring to FIG. 18, the decreasing trend of the discharge capacity can be more clearly confirmed.

C. Analysis on Surface of Negative Electrode Current Collector

The result of the $PdTe_2$ deposition on the surface of a negative electrode current collector was observed through field-emission scanning electron microscopy (FE-SEM) and energy dispersive X-ray spectroscopy (EDX). The presence of a $PdTe_2$ layer and the presence of a CuTe layer was confirmed through X-ray diffraction analysis (XDA).

After 100 cycles of charging and discharging of the half cell, the cross section and the surface of the negative electrode current collector were image with a scanning electron microscope (SEM) and the obtained images are shown in (a) to (f) of FIG. 9.

The surface of the negative electrode current collector subjected to the 100th cycle in the 0.5 C-rate charge/discharge test of the full cell was imaged with an SEM, and the obtained images are shown in FIGS. 14A and 14B.

The surface of the negative electrode current collector subjected to the 100th cycle in the 0.2 C-rate charge/discharge test of the full cell was imaged with an SEM, and the obtained images are shown in FIG. 18.

In addition, the deposition thickness of the $PdTe_2$ layer on the surface of the negative electrode current collector was measured with an atomic force microscope (AFM), and the measurement results are shown in FIGS. 15A and 15B.

Figure 2B:
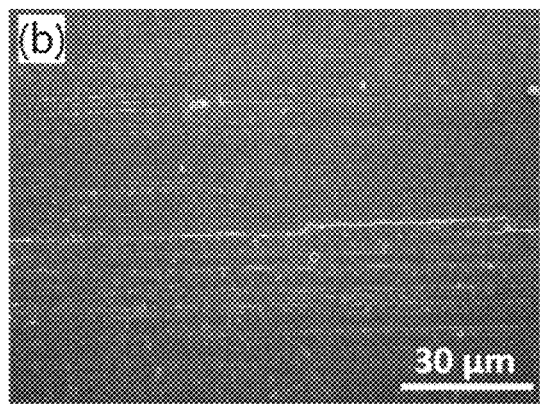
FIG. 2B is an SEM image of the copper-based negative electrode current collector.
Figure 3A:
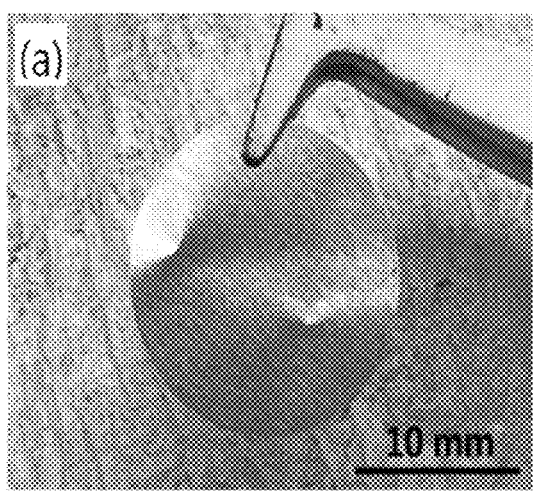
FIG. 3A is a photograph of a negative electrode current collector for an anode-free lithium metal battery according to one embodiment of the present invention.
Figure 3B:
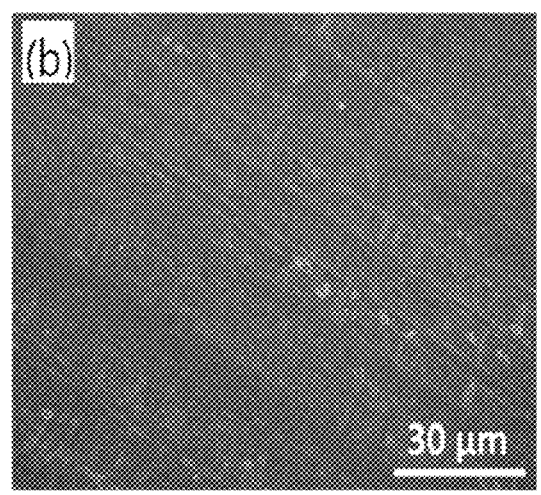
FIG. 3B is an SEM image of a negative electrode current collector for an anode-free lithium metal battery according to one embodiment of the present invention.

Referring to FIG. 3, it can be seen that that Pd and Te are well deposited on the negative electrode current collector, and there is no substantial difference in surface morphology between the surface of the copper negative electrode current collector of FIGS. 2A and 2B and the surface of the negative electrode current corrector of FIGS. 3A and 3B.

(a) of FIG. 9 is a cross-sectional view of the negative electrode current collector of Comparative Example 1. Referring to (a) of FIG. 9, a mossy lithium layer is formed, and an upper lithium layer and a lower current collector are separated from each other. In this state, electron movement between the current collector and the lithium layer is not easy, resulting in a high overpotential and a high probability of additional dead lithium.

(b) of FIG. 9 is a cross-sectional view of the anode current collector of Example 1. Referring to (b) of FIG. 9, the lithium layer and the current collector can be distinguished from each other, but there is no separation between the lithium layer and the current collector. In addition, it is seen that lithium is uniformly reduced.

Referring to FIGS. 15A and 15B, similarly to the case of the half-cell, it is seen that the lithium surface of Example 1 is very even, and the boundary is not clearly distinguished. On the other hand, in the case of Comparative Example 1, there are a lot of cracks on the surface, and the boundary is clearly distinguished, which is not desirable.

Referring to FIGS. 19A and 19B, the surface of Example 1 did not contain precipitated or fragmented lithium thereon, whereas the surface of Comparative Example 1 had a large amount of precipitated or fragmented lithium.

The present invention has been described with reference to some specific examples and characters. However, the specific examples and characteristics are only for illustrative purposes and are intended to limit the scope of the present invention, and it will be appreciated that various modifications and changes are possible from the above description by those skilled in the art to which the present invention pertains.

Therefore, the spirit of the present invention is not limited to the specific examples described above, and all forms defined by the appended claims and all equivalents and modifications thereto fall within the scope of the present invention.

What is claimed is:

1. An anode-free lithium metal battery comprising a cathode, a negative electrode current collector, an electrolyte, and a separator, wherein
   the negative electrode current collector comprises a transition metal dichalcogenide layer and a transition metal intermediate layer,
   wherein the transition metal dichalcogenide layer is made of a material satisfying the chemical formula "$MX_2$", and the transition metal intermediate layer is made of a material satisfying the chemical formula "MX", and
   wherein M is selected from the group consisting of Pd, Pt, Cu, Ag, and Au, and X is selected from the group consisting of S, Se, and Te.

2. The anode-free lithium metal battery of claim 1, wherein
   the negative electrode current collector further comprises an artificial solid-electrolyte interface (SEI).

3. The anode-free lithium metal battery of claim 1, wherein
   wherein the transition metal dichalcogenide layer has a thickness in a range of 2 to 20 nm.

4. The anode-free lithium metal battery of claim 2, wherein
   the artificial SEI comprises lithium phosphorous oxynitride (LiPON).

* * * * *